(12) United States Patent
Zijp et al.

(10) Patent No.: US 7,718,091 B2
(45) Date of Patent: May 18, 2010

(54) COATING WHICH IS APPLIED TO SUBSTRATE, A SOLAR CELL, AND METHOD FOR APPLYING THE COATING TO THE SUBSTRATE

(75) Inventors: Johannes Petrus Zijp, Oisterwijk (NL); Antonius Maria B. van Mol, Eindhoven (NL); Frank Theodoor J. Grob, Eindhoven (NL)

(73) Assignee: Nederlandse Organisatie Voor Toegepast-Natuurwetenschappelijk Onderzoek TNO, Delft (NL)

( * ) Notice: Subject to any disclaimer, the term of this patent is extended or adjusted under 35 U.S.C. 154(b) by 0 days.

(21) Appl. No.: 10/574,484

(22) PCT Filed: Oct. 1, 2004

(86) PCT No.: PCT/NL2004/000680

§ 371 (c)(1),
(2), (4) Date: Oct. 25, 2006

(87) PCT Pub. No.: WO2005/036659

PCT Pub. Date: Apr. 21, 2005

(65) Prior Publication Data

US 2007/0122632 A1 May 31, 2007

(30) Foreign Application Priority Data

Oct. 2, 2003 (NL) .................................. 1024437

(51) Int. Cl.
*H01B 1/00* (2006.01)
*B05D 5/12* (2006.01)

(52) U.S. Cl. ........................ 252/500; 136/242; 136/243; 136/244; 136/247; 136/256; 136/257; 136/258; 136/259; 136/263; 257/79; 427/165; 428/212; 428/336; 428/432

(58) Field of Classification Search ................. 252/500; 250/214 LA; 427/165; 428/336, 432, 212; 136/257, 259, 261, 256, 258, 242, 243, 244, 136/247, 263; 257/79
See application file for complete search history.

(56) References Cited

U.S. PATENT DOCUMENTS 3,984,591 A * 10/1976 Plumat et al. ................ 427/165

(Continued)

FOREIGN PATENT DOCUMENTS

JP          60147176         1/1984

(Continued)

OTHER PUBLICATIONS

Tominaga et al, "Transparent conductive ZnO film preparation by alternating . . .", Thin Solid Films, Elsevier-Sequoia S.A., 334 (1998) 35-39; XP004157844.

(Continued)

*Primary Examiner*—Mark Kopec
*Assistant Examiner*—Khanh Tuan Nguyen
(74) *Attorney, Agent, or Firm*—Nixon & Vanderhye P.C.

(57) ABSTRACT

The invention relates to a coating which has been applied to a substrate, comprising at least a first film and a second film which have been applied on top of each other and each comprise a transparent conducting oxide and an electron donor, wherein the second film comprises relatively at least 10 percent less electron donor than the first film. The invention also relates to a solar cell comprising a coating according to the invention. The invention further relates to a method for applying the coating according to the invention to a substrate, wherein at least a first and a second mixture which each comprise one or more precursors for a transparent conducting oxide and an electron donor are applied to the substrate, wherein the second mixture is composed such that relatively at least 10 percent less electron donor is incorporated in the film compared with the film deposited by the first mixture.

16 Claims, 3 Drawing Sheets the XRD spectrum of a highly doped tin oxide

U.S. PATENT DOCUMENTS

| | | | | |
|---|---|---|---|---|
| 4,338,482 | A | * | 7/1982 | Gordon ........................ 136/256 |
| 4,694,116 | A | * | 9/1987 | Hayashi et al. .............. 136/256 |
| 4,732,621 | A | * | 3/1988 | Murata et al. ................ 136/256 |
| 4,900,634 | A | * | 2/1990 | Terneu et al. ................. 428/432 |
| 5,078,803 | A | * | 1/1992 | Pier et al. .................... 136/256 |
| 6,166,368 | A | * | 12/2000 | Marion et al. ......... 250/214 LA |
| 6,218,018 | B1 | * | 4/2001 | McKown et al. ............. 428/432 |
| 6,231,971 | B1 | * | 5/2001 | Terneu et al. ................. 428/336 |
| 6,320,117 | B1 | * | 11/2001 | Campbell et al. ............ 136/258 |
| 6,344,608 | B2 | * | 2/2002 | Kariya et al. ................. 136/257 |
| 6,858,306 | B1 | * | 2/2005 | Strickler et al. .............. 428/432 |
| 7,396,580 | B2 | * | 7/2008 | Kawashima et al. ......... 428/212 |

FOREIGN PATENT DOCUMENTS

| | | | |
|---|---|---|---|
| JP | 59-094472 | | 5/1984 |
| JP | 62-179165 | | 8/1987 |
| JP | 62-211966 | * | 9/1987 |
| JP | 02-231773 | * | 9/1990 |
| JP | 05-067797 | * | 3/1993 |
| JP | 08-043840 | * | 2/1996 |
| JP | 11-298018 | * | 10/1999 |
| JP | 2000-252500 | | 9/2000 |

OTHER PUBLICATIONS

Romeo et al, "A highly efficient and stable CdTe/CdS . . .", Solar Energy Materials & Solar Cells, Elsevier Science Publishers, 58 (1999) 209-218; XP004177956.

Romeo et al, "Comparison of different conducting oxides as substrates . . .", Thin Solid Films, Elsevier Sequoia, 431-432 (2003) 364-368; XP004428668.

* cited by examiner

Fig. 1: the XRD spectrum of a highly doped tin oxide

Fig. 2: the XRD spectrum of a lowly doped tin oxide

COATING WHICH IS APPLIED TO SUBSTRATE, A SOLAR CELL, AND METHOD FOR APPLYING THE COATING TO THE SUBSTRATE This application is the US national phase of international application PCT/NL2004/000680, filed 1 Oct. 2004, which designated the U.S. and claims priority of NL 1024437, filed 2 Oct. 2003, the entire contents of each of which are hereby incorporated by reference.

BACKGROUND OF THE INVENTION

The invention relates to a coating which is applied to a substrate, a solar cell comprising the coating according to the invention, and a method for applying the coating to a substrate.

It is known that, for solar cells, the upper electrode needs to meet at least the following requirements in order to effect a good efficiency:

1. the electrode needs to have a high transparency for the incident light;
2. the electrode needs to effect a good conduction of the current generated in the active layer; and
3. the surface morphology of the electrode needs to be such that the incident light is captured in the solar cell.

Known materials which can meet these requirements are the so-called transparent conducting oxides such as tin oxide, zinc oxide or indium tin oxide. These are semiconductors with such a bandgap that light in the visual spectrum is transmitted. In order to effect a right conduction, and thus meet the second requirement, a limited number of free electrons are created in this material by addition of dopant and/or by creating oxygen deficiencies.

In order meet the third requirement, the upper electrode needs to have an optimal surface morphology so that the incident light is refracted and the distance covered through the underlying active layer increases such that the efficiency of the solar cell is considerably improved.

Such an application is for instance known from Japanese patent specification 05 067797 in which an upper electrode is described which comprises tin oxide of which the dominant crystalline orientation is the (200) orientation, and with which an increased efficiency of a solar cell is effected.

However, recent research has shown that, with the upper electrodes used in practice, which are also described in the Japanese patent specification, the requirement of a good electrical conductivity of the upper electrical electrode is at odds with the requirement that the electrode also needs to have an optimal surface morphology. It can be concluded from this that the efficiency of the known solar cells is by no means optimal yet.

It has now surprisingly been found that an upper electrode for a solar cell can be developed which has both a good electrical conductivity and has an optimal surface morphology, when the electrode consists of a coating which comprises at least two films which both comprises a transparent conducting oxide and an electron donor, and the contents of electron donor differ in the two films.

It has further surprisingly been found that, in contrast to what is known from Japanese patent specification 05 067797, a (200) dominant orientation is no condition for an optimal capture of the light in the solar cell and that a capture which is at least as good can be obtained with a dominant (211) and (110) orientation.

Although the (200) orientation and (110) orientation are dominant in a normal process control—as described in the aforementioned Japanese patent specification—it has surprisingly been found that, under specific process conditions, such as for instance an elevated content of electron donors, the (211) orientation becomes dominant. It has further surprisingly been found that a next film which is then applied to this film 'inherits' this dominant orientation, even if the film would normally not yield a dominant (211) orientation.

BRIEF SUMMARY OF THE INVENTION

The invention therefore relates to a coating which has been applied to a substrate, comprising at least a first film and a second film which have been applied on top of each other and which each comprise a transparent conducting oxide and an electron donor, while the second film comprises relatively at least 10 percent less electron donor than the first film.

Figure 1:
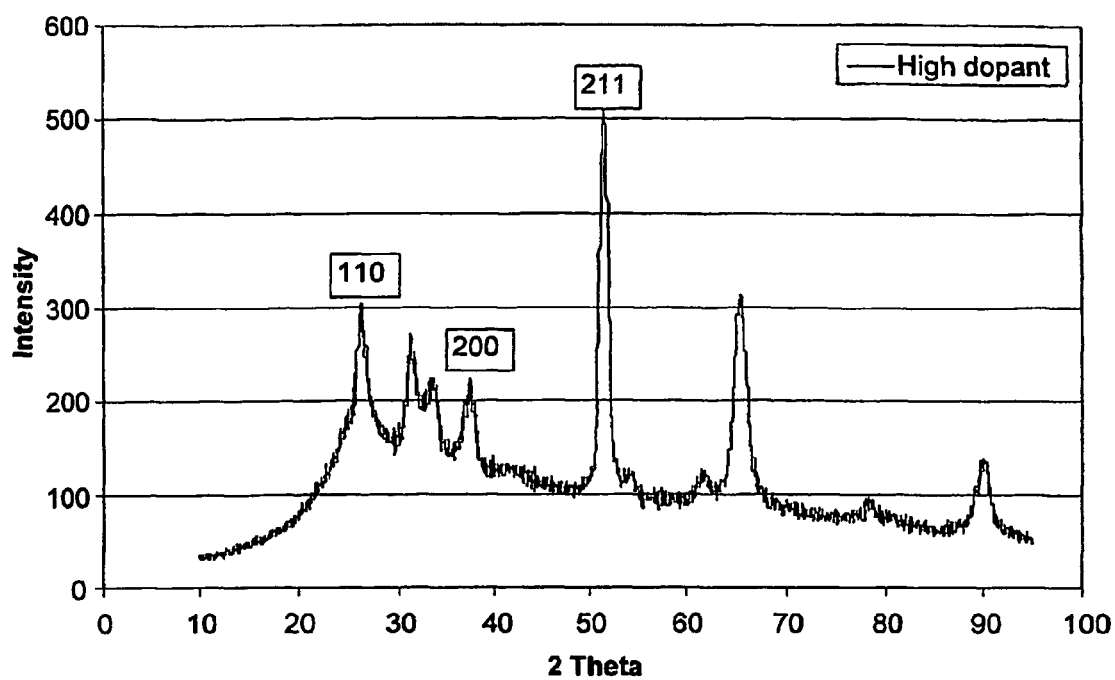
FIG. 1 shows the X-ray diffraction spectrum (XRD) of a fluorine-doped tin oxide-coated substrate where the tin oxide contains a high content of electron donors.

The coating may possibly also consist of one or more films which have been applied to a substrate, while the composition of the coating has such a gradient over the thickness that the material applied later comprises relatively at least 10 percent less electron donor than the material applied earlier.

The first film may have been applied to a substrate or it may have been applied to the active layer of a solar cell. Preferably, the first film is applied to a substrate.

BRIEF SUMMARY OF THE INVENTION

In the coating according to the invention, the second film comprises relatively at least 10 percent less electron donor than the first film. Preferably, the second film comprises relatively at least 25 percent less electron donor than the first film. More preferably, the second film comprises relatively at least 50 percent less electron donor than the first film.

As an electron donor, oxygen deficiencies and/or the conventional dopants can be used here. The first and second films may comprise one or more dopants. In a suitable embodiment, the first and second films each comprise one particular type of dopant. Preferably, in the first and second films, the same type of dopant is used or only one of the two films contains a dopant and the other film contains oxygen deficiencies. Preferably, the dopants are chosen from the group of fluorine, antimony, chlorine, tin, zinc, gallium, boron, niobium and/or aluminum. More preferably, the dopants are chosen from the group of fluorine, chlorine, antimony and/or niobium, and still more preferably, the dopant comprises fluorine.

Preferably, the electron donor is present in the second film in an amount of at most 13 atomic percent, and more preferably in an amount of at most 8 atomic percent.

Preferably, the electron donor is present in the first film in an amount of at most 15 atomic percent, and more preferably in an amount of at most 10 atomic percent.

As a transparent conducting oxide, the conventional materials can be used. The first and second films can comprise one or more types of transparent conducting oxides. In a suitable embodiment of the invention, the first and second films each comprise one particular type of transparent conducting oxide.

Preferably, the first and second films comprise the same type of transparent conducting oxide. The transparent conducting oxides are preferably chosen from the group of tin oxide, zinc oxide an/or indium tin oxide. In a particularly suitable embodiment of the invention, the first and second films comprise tin oxide.

As a substrate, the conventional materials can be used. Preferably, the substrate comprises a metal, ceramic, glass or a material comprising one or more polymers, such as for instance a plastic. Here, the substrate may possibly have already been provided with a coating or assembly of coatings.

This coating may for instance be intended for the improvement of the bonding of the transparent conducting layer or as a barrier coating which is to prevent diffusion of harmful elements. The coating may also consist of an assembly of coatings which comprises inter alia the active layer of the solar cell.

The invention also relates to a coating which has been applied to a substrate, which coating comprises at least a first film and a second film which each comprise a transparent conducting oxide and an electron donor, while the second film comprises tin oxide of which the two dominant crystalline orientations are the (211) and (110) orientations.

In that case, preferably, the first film is applied to a substrate or to the active layer of the solar cell. Preferably, the first film has been applied to a substrate. In a particularly suitable embodiment, both the first and second films comprise tin oxide.

In the different embodiments of the coating according to the invention, in the second film, the average particle size of the crystals of the transparent conducting oxide is 50-500 nm, preferably 100-300 nm.

Preferably, the second film has a total thickness of 300-900 nm. Preferably, the first film has a total thickness of 50-500 nm.

In a particularly suitable embodiment of the invention, the coating has a total thickness of 300-1000 nm.

The invention further relates to a solar cell which comprises a coating according to the invention. The first film may have been applied to the active layer after which the second film has been applied to the top side of the first film. After this, a substrate is usually applied to the second film of the coating for protection. In a different embodiment, which is preferred, the first film is applied to a substrate, after which the second film is applied to the top side of the first film. Then, the active layer and the other components of the solar cell are applied to the coated substrate thus obtained.

The invention further relates to a method for applying the coating according to the invention to a substrate, in which at least a first and second mixture which each comprise one or more precursors for a transparent conducting oxide and an electron donor are applied to the substrate, while the second mixture is composed such that relatively at least 10 percent less electron donor is incorporated in the film compared with the film deposited by the first mixture.

Preferably, the first mixture is applied to the substrate, after which the second mixture is applied to the top side of the first film and the second film is formed.

The first and second film can be made with known techniques. Such techniques are for instance the plasma spraying technique, the chemical vapor deposition technique, the plasma-enhanced chemical vapor deposition technique, the physical vapor deposition technique and the plasma-enhanced physical vapor deposition technique, where conventional process conditions are used. In order to prepare a film which comprises tin oxide, these techniques can be used where for instance a mixture of tin tetrachloride, water, methanol and hydrogen fluoride is used.

EXAMPLES

The following examples illustrate the present invention.

FIG. 1 shows the X-ray diffraction spectrum (XRD) of a fluorine-doped tin oxide-coated substrate where the tin oxide contains a high content of electron donors. The electron density as measured with the well-known Hall measurement is fairly high at $6.5 \cdot 10^{20}$ cm$^{-3}$, which results in a good electrical conductivity of the film. However, the XRD spectrum shows that the crystallinity of the film is moderate with a maximum intensity of only 500 at the (211) peak. This is only 5 times higher than the background.

Figure 2:
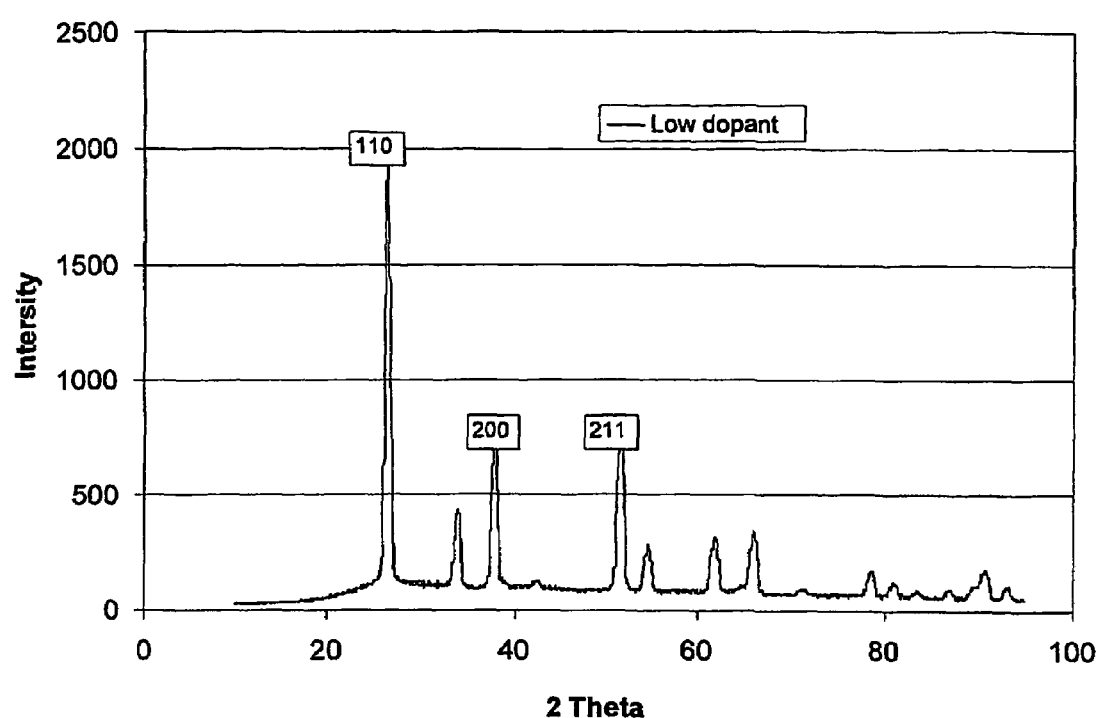
FIG. 2 shows the XRD spectrum of a film with a low content of electron donors.

For comparison, FIG. 2 shows the XRD spectrum of a film with a low content of electron donors. This film has a measured electron density of $4.2 \cdot 10^{20}$ cm$^{-3}$. As can easily be recognized in FIG. 2, this film has a much better defined crystallographic orientation with a maximum peak for the (110) orientation. The intensity of this peak is approximately 2000, which is 20 times higher than the background.

Figure 3:
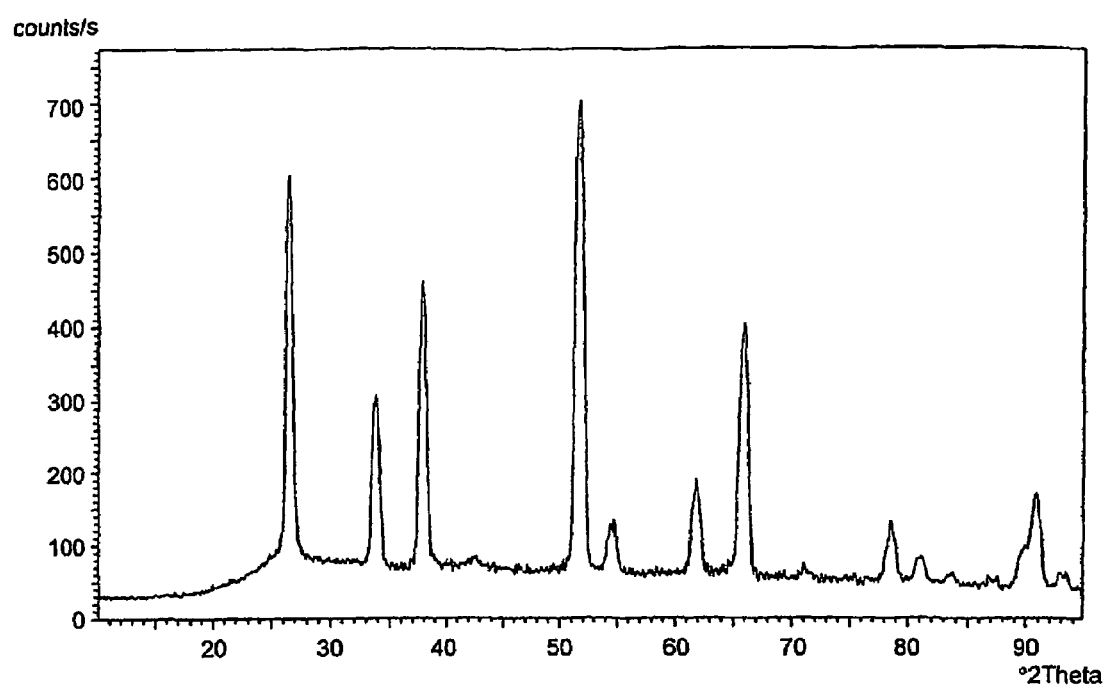
FIG. 3 shows the XRD spectrum of a double-layer coating as described in this patent.

FIG. 3 shows the XRD spectrum of a double-layer coating as described in this patent. This coating comprises a first film with a high content of electron donors and a second film with a low content of electron donors. It is clear that the crystallinity of the coating is very good and the (211) orientation is present here with preference over the (110) and (200). This is a clear indication that the film deposited later with the low dopant concentration 'inherits' its preferred crystallographic orientation from the film deposited first with the high dopant concentration.

The invention claimed is:

1. A coating which has been applied to a substrate, comprising at least a first film and a second film which have been applied on top of each other the first film being applied to the substrate, and each comprise a transparent conducting oxide and an electron donor, wherein the first film has a thickness of 50-500 nm and the second film has a thickness of 300-900 nm and comprises relatively at least 10 percent less electron donor than the first film, and the first film and the second film both have a (211) dominant orientation.

2. A coating according to claim 1, wherein the second film comprises relatively at least 25 percent less electron donor than the first film.

3. A coating according to claim 2, wherein the second film comprises relatively at least 50 percent less electron donor than the first film.

4. A coating according to claim 1, wherein the electron donor is formed by oxygen deficiencies or is chosen from a dopant selected from the group consisting of fluorine, antimony, chlorine, gallium, tin, zinc, boron, niobium, aluminum and mixtures thereof or the electron donor is formed by oxygen deficiencies and is a dopant selected from the group consisting of fluorine, antimony, chlorine, gallium, tin, zinc, boron, niobium and aluminum.

5. A coating according to claim 4, wherein the dopant is chosen from the group consisting of fluorine, chlorine, antimony, niobium and mixtures thereof.

6. A coating according to claim 5, wherein the dopant comprises fluorine.

7. A coating according to claim 1, wherein the electron donor is present in the second film in an amount of at most 13 atomic percent.

8. A coating according to claim 1, wherein the electron donor is present in the first film in an amount of at most 15 atomic percent.

9. A coating according to claim 1, wherein the transparent conducting oxide is chosen from the group consisting of tin oxide, zinc oxide, indium tin oxide and mixtures thereof.

10. A coating according to claim 9, wherein the first film and second film comprise tin oxide.

11. A coating according to claim 1, wherein, in the second film, the average particle size of the crystals of the transparent conducting oxide is 50-500 nm.

12. A coating according to claim 1, wherein the coating has a total thickness of 300-1000 nm.

13. A coating according to claim 1, wherein the substrate is made of metal, ceramic or glass or of a material which comprises one or more polymers.

14. A solar cell comprising a coating according to claim 1.

15. A method for applying the coating to a substrate, wherein the coating comprises at least a first film and a second film which have been applied on top of each other the first film being applied to the substrate, and each comprise a transparent conducting oxide and an electron donor, wherein the first film has a thickness of 50-500 nm and the second film has a thickness of 300-900 nm and comprises relatively at least 10 percent less electron donor than the first film, and the first film and the second film both have a (211) dominant orientation, and wherein at least a first and a second mixture which each comprise one or more precursors for a transparent conducting oxide and an electron donor are applied to the substrate, wherein the second mixture is composed such that relatively at least 10 percent less electron donor is incorporated in the second film.

16. A method according to claim 15, wherein the first mixture is applied to the substrate and the first film is formed, after which the second mixture is applied to the top side of the first film and the second film is formed.

* * * * *